(12) United States Patent
Pyo

(10) Patent No.: US 8,343,786 B2
(45) Date of Patent: Jan. 1, 2013

(54) ORGANIC LIGHT EMITTING DIODE DISPLAY AND MANUFACTURING METHOD THEREOF

(75) Inventor: Sung-Chul Pyo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/068,406

(22) Filed: May 9, 2011

(65) Prior Publication Data

US 2012/0056188 A1 Mar. 8, 2012

(30) Foreign Application Priority Data

Sep. 7, 2010 (KR) .................. 10-2010-0087595

(51) Int. Cl.
*H01L 21/00* (2006.01)
(52) U.S. Cl. .............. 438/34; 257/72; 257/E33.003
(58) Field of Classification Search .............. 257/72, 257/E33.003; 438/34
See application file for complete search history.

(56) References Cited

FOREIGN PATENT DOCUMENTS

| KR | 1020070034824 A | 3/2007 |
|---|---|---|
| KR | 1020090019435 A | 2/2009 |

*Primary Examiner* — Kimberly Rizkallah
*Assistant Examiner* — Marvin Payen
(74) *Attorney, Agent, or Firm* — Christie, Parker & Hale, LLP

(57) ABSTRACT

The described technology relates generally to an OLED display and manufacturing method thereof. The OLED display includes a substrate, a thin film transistor on the substrate and including a semiconductor layer, a gate electrode, a source electrode, and a drain electrode, and an organic light emitting element coupled to the thin film transistor and including a pixel electrode, an organic emission layer, and a common electrode, wherein the semiconductor layer is formed of a polycrystalline silicon layer, and remnants and contaminants at a surface of the polycrystalline silicon layer are reduced or eliminated through an atmospheric pressure plasma treatment. The semiconductor layer is formed of a polycrystalline silicon layer where remnants and contaminants at the surface thereof are reduced or eliminated through an atmospheric pressure plasma treatment.

11 Claims, 12 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2010-0087595 filed in the Korean Intellectual Property Office on Sep. 7, 2010, the entire contents of which are incorporated herein by reference.

BACKGROUND

1. Field

The described technology relates generally to an organic light emitting diode (OLED) display and a manufacturing method thereof.

2. Description of Related Art

An organic light emitting diode (OLED) display includes an organic light emitting element and a thin film transistor as a driving element that drives the organic light emitting element.

In a thin film transistor manufacturing process, remnants and contaminants remain in or at a surface after each process. The remnants and the contaminants distort an element structure and deteriorate an electric characteristic, thereby deteriorating performance and reliability of the element. The remnants and the contaminants include organic contaminants, particles, metal impurities, and a native oxide, and they should be eliminated through a cleansing process.

A polycrystalline silicon layer used as a semiconductor layer in the thin film transistor is formed by crystallizing amorphous silicon with thermal treatment. The native oxide is formed when the polycrystalline silicon layer is formed, and a contaminant like a metal impurity may be included in the native oxide while the native oxide is growing. The native oxide deteriorates the performance of the polycrystalline silicon layer and increases contact resistance. The metal impurity may diffuse into the polycrystalline silicon layer, which may cause a failure in the element during a post heat treatment.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a method for manufacturing an organic light emitting diode (OLED) display, having features of effectively reducing or eliminating various contaminants, such as a native oxide and metal impurities that may be generated during a process for forming a polycrystalline silicon layer, and an OLED display manufactured using the same.

An OLED display according to an exemplary embodiment of the present invention includes a substrate, a thin film transistor on the substrate and including a semiconductor layer, a gate electrode, a source electrode, and a drain electrode, and an organic light emitting element coupled to the thin film transistor and including a pixel electrode, an organic emission layer, and a common electrode, wherein the semiconductor layer is formed of a polycrystalline silicon layer, and remnants and contaminants at a surface of the polycrystalline silicon layer are reduced or eliminated through an atmospheric pressure plasma treatment.

The polycrystalline silicon layer may be formed by crystallizing an amorphous silicon layer using one of solid phase crystallization, sequential lateral solidification crystallization, excimer laser annealing, metal conductive crystallization, or metal conductive lateral crystallization.

A native oxide at the surface of the polycrystalline silicon layer may be reduced or eliminated through a first portion of the atmospheric pressure plasma treatment using a plasmatized fluorine-containing gas.

The polycrystalline silicon layer may be formed by crystallizing an amorphous silicon layer using one of solid phase crystallization, sequential lateral solidification crystallization, excimer laser annealing, metal conductive crystallization, or metal conductive lateral crystallization.

Organic and metal contaminants at the surface of the polycrystalline silicon layer may be reduced or eliminated through a second portion of the atmospheric pressure plasma treatment using a plasmatized oxygen-containing gas, the second portion of the atmospheric pressure plasma treatment occurring after the first portion of the atmospheric pressure plasma treatment.

The polycrystalline silicon layer may be formed by crystallizing an amorphous silicon layer using one of solid phase crystallization, sequential lateral solidification crystallization, excimer laser annealing, metal conductive crystallization, or metal conductive lateral crystallization.

A method for manufacturing an OLED display according to an exemplary embodiment of the present invention includes forming a polycrystalline silicon layer on a substrate, reducing or eliminating a native oxide at a surface of the polycrystalline silicon layer by etching using a first atmospheric pressure plasma generated by plasmatizing fluorine-containing gas, reducing or eliminating organic and metal contaminants at the surface of the polycrystalline silicon layer using a second atmospheric pressure plasma generated by plasmatizing oxygen-containing gas, forming a semiconductor layer by patterning the polycrystalline silicon layer, forming a gate insulating layer and a gate electrode on the semiconductor layer, forming a channel area, a source area, and a drain area in the semiconductor layer by impurity doping, forming an interlayer insulating layer on the gate electrode, forming a source electrode coupled with the source area on the interlayer insulating layer, forming a drain electrode coupled with the drain area on the interlayer insulating layer, forming a pixel electrode coupled with the drain electrode; and forming an organic emission layer and a common electrode on the pixel electrode.

Reducing or eliminating the native oxide and reducing or eliminating the organic and metal contaminants may follow forming the polycrystalline silicon layer and may include placing the substrate between a driving electrode and a ground electrode of a cleansing device after forming the polycrystalline silicon layer, and applying 10 kW to 20 kW to the driving electrode.

Reducing or eliminating the native oxide and reducing or eliminating the organic and metal contaminants may include using a single cleansing device at a single location.

The plasmatized oxygen-containing gas may include argon (Ar) gas, oxygen ($O_2$) gas, and nitrogen ($N_2$) gas.

Reducing or eliminating the native oxide and reducing or eliminating the organic and metal contaminants may follow forming the polycrystalline silicon layer and may include placing the substrate between a driving electrode and a ground electrode of a cleansing device after forming the polycrystalline silicon layer, and applying 10 kW to 20 kW to the driving electrode.

When reducing or eliminating organic and metal contaminants of the polycrystalline silicon layer, a flow rate of Ar gas may be 1 sccm to 5 sccm, a flow rate of $O_2$ gas may be 1 sccm to 10 sccm, and a flow rate of $N_2$ gas may be 800 lpm to 1,000 lpm.

Reducing or eliminating the native oxide and reducing or eliminating the organic and metal contaminants may follow forming the polycrystalline silicon layer and may include placing the substrate between a driving electrode and a ground electrode of a cleansing device after forming the polycrystalline silicon layer, and applying 10 kW to 20 kW to the driving electrode.

The plasmatized fluorine-containing gas may include sulfur hexafluoride ($SF_6$) gas, oxygen ($O_2$) gas, and nitrogen ($N_2$) gas.

Reducing or eliminating the native oxide and reducing or eliminating the organic and metal contaminants may follow forming the polycrystalline silicon layer and may include placing the substrate between a driving electrode and a ground electrode of a cleansing device after forming the polycrystalline silicon layer, and applying 10 kW to 20 kW to the driving electrode.

When reducing or eliminating the native oxide of the polycrystalline silicon layer, a flow rate of $SF_6$ gas may be 1 sccm to 5 sccm, a flow rate of $O_2$ gas may be 1 sccm to 5 sccm, and a flow rate of $N_2$ gas may be 800 lpm to 1,000 lpm.

Reducing or eliminating the native oxide and reducing or eliminating the organic and metal contaminants may follow forming the polycrystalline silicon layer and may include placing the substrate between a driving electrode and a ground electrode of a cleansing device after forming the polycrystalline silicon layer, and applying 10 kW to 20 kW to the driving electrode.

According to exemplary embodiments of the present invention, a first atmospheric pressure plasma can be generated with uniform density over a large area between the driving electrode and the ground electrode so that the native oxide can be uniformly etched by inducing a uniform chemical reaction at the surface of the polycrystalline silicon layer. In addition, secondary cleansing using a second atmospheric pressure plasma is performed at the same location using the same equipment of primary cleansing after changing only a reaction gas, and therefore the polycrystalline silicon layer can be cleansed with high efficiency and low cost.

DETAILED DESCRIPTION

Embodiments of the present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

It will be understood that when an element such as a layer, film, region, or substrate is referred to as being "on" another element, it can be directly on the other element, or intervening elements may also be present. In the specification and the claims that follow, when it is described that an element is "coupled" to another element, the element may be "directly coupled" to the other element, or may be "electrically coupled" to the other element through one or more additional elements.

Figure 1:
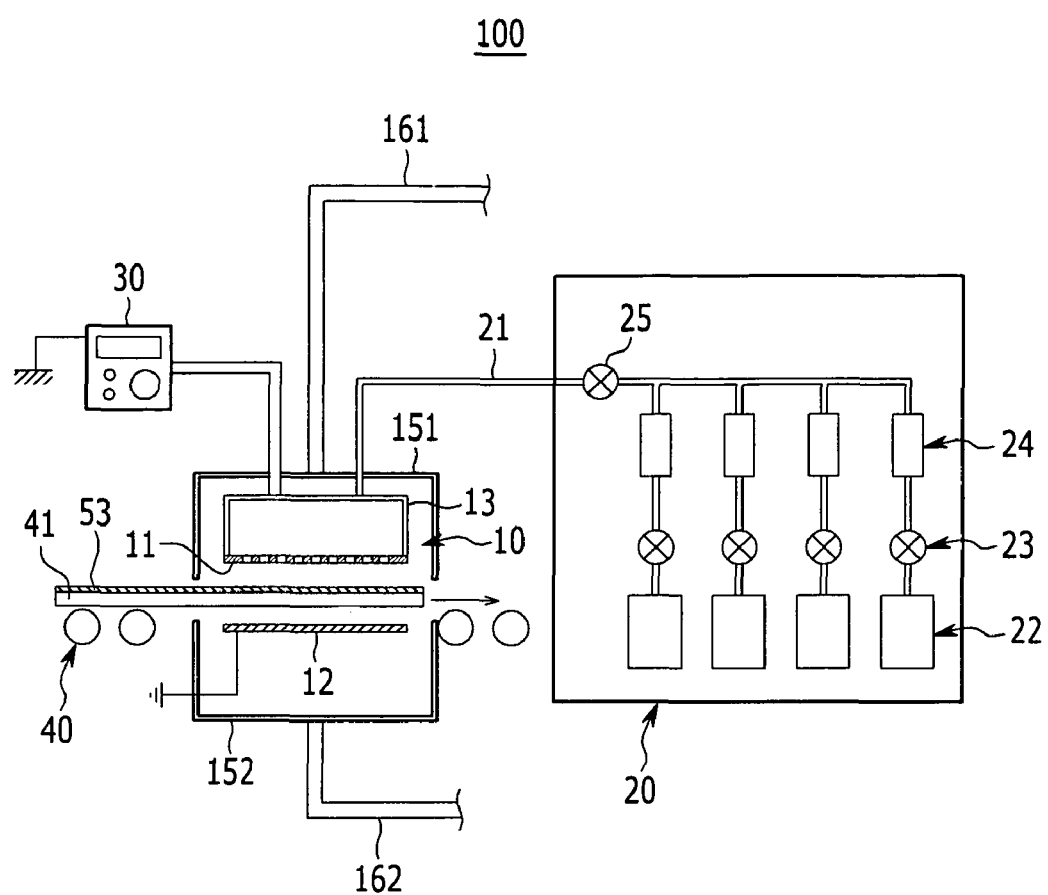
FIG. 1 is a schematic diagram of a cleansing device for manufacturing an organic light emitting diode (OLED) display according to an exemplary embodiment of the present invention.
Figure 2:
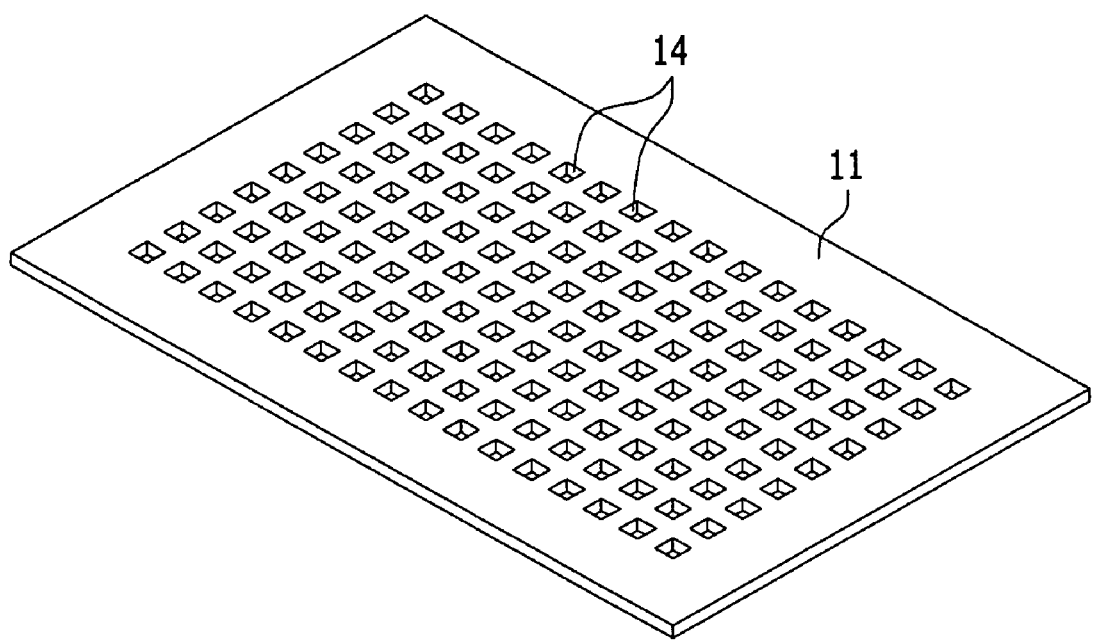
FIG. 2 is a perspective view of a driving electrode of the cleansing device of the embodiment shown in FIG. 1.

FIG. 1 is a schematic diagram of a cleansing device for manufacturing an organic light emitting diode (OLED) display according to an exemplary embodiment of the present invention, and FIG. 2 is a perspective view of a driving electrode of the cleansing device of the embodiment shown in FIG. 1.

Referring to FIG. 1 and FIG. 2, a cleansing device 100 includes a plasma generator 10, a reaction gas supply 20, and a power supply 30.

The plasma generator 10 includes a driving electrode 11 and a ground electrode 12, the electrodes 11 and 12 having a distance therebetween. The driving electrode 11 is coupled with the power supply 30 and receives a driving voltage for generating an atmospheric pressure plasma therefrom. The driving voltage may be a DC voltage The ground electrode 12 is located below the driving electrode 11, and a substrate loading unit 40 that loads and transfers a substrate 41 is located between the driving electrode 11 and the ground electrode 12.

An electrode cover 13 coupled with a reaction gas supply pipe 21 is located above the driving electrode 11. The electrode cover 13 forms an inner space for receiving a reaction gas, and the driving electrode 11 forms a plurality of openings 14 (shown in FIG. 2) through which the reaction gas passes. The reaction gas supplied to the electrode cover 13 is ionized while passing through the openings 14 of the driving electrode 11 such that an atmospheric pressure plasma is generated between the driving electrode 11 and the ground electrode 12.

FIG. 2 shows that quadrangle (or rectangular) openings 14 are arranged in rows and columns with a distance therebetween along a horizontal direction and a vertical direction of the driving electrode 11 (e.g., quadrangle openings 14 are arranged in a matrix pattern on the driving electrode 11). However, the shape of the driving electrode 11 is not limited thereto, and can be variously modified.

Referring back to FIG. 1, a first cover 151 having an open lower end is located near outer sides of the driving electrode 11 and the electrode cover 13, and a second cover 152 having an open upper end is located near outer sides of the ground electrode 12. An upper suction pipe 161 is coupled to the first cover 151 and a lower suction pipe 162 is coupled to the second cover 152. The upper suction pipe 161 and the lower suction pipe 162 are coupled with a gas capturing unit (not shown). Harmful gases generated during the cleansing process, such as ozone, can be captured and treated using the upper and lower suction pipes 161 and 162 and the gas capturing unit.

The reaction gas supply 20 includes a plurality of storage tanks 22, a plurality of first control valves 23, and a plurality of flow controllers 24. The reaction gas supply 20 supplies a first reaction gas for generating a first atmospheric pressure plasma during primary cleansing, and supplies a second reaction gas for generating a second atmospheric pressure plasma during secondary cleansing.

The first reaction gas includes a sulfur hexafluoride ($SF_6$) gas, an oxygen ($O_2$) gas, and a nitrogen ($N_2$) gas. The second reaction gas includes an argon (Ar) gas, an oxygen ($O_2$) gas, and a nitrogen ($N_2$) gas. The plurality of storage tanks 22 store the $SF_6$ gas, the $O_2$ gas, the $N_2$ gas, and the Ar gas.

The plurality of first control valves 23 and the plurality of flow controls 24 are provided in pipes coupled with the plurality of storage tanks 22 to control supply of gases stored in the storage tanks 22. A second control valve 25 that is coupled with a plurality of reaction gas supply pipes 21 and controls the supply of a reaction gas is provided in the reaction supply pipe 21.

The substrate 41 where the polycrystalline silicon layer 53 is formed is transferred by the substrate loading unit 40 and positioned between the driving electrode 11 and the ground electrode 12. The polycrystalline silicon layer 53 is exposed to the first atmospheric pressure plasma, which is acquired (e.g., made) by plasmatizing the first reaction gas, such that primary cleansing is performed, and exposed to the second atmospheric pressure plasma, which is acquired by plasmatizing the second reaction gas, such that secondary cleansing is performed.

The first and second atmospheric pressure plasma sufficiently contain reaction materials, such as electrons or excited atoms, and the reaction materials react with contaminants at the surface of the polycrystalline silicon layer such that a chemical reaction occurs and the cleansing process is carried on.

FIG. 3A to FIG. 3G show cross-sectional views of a manufacturing process of a thin film transistor for the OLED display according to an exemplary embodiment of the present invention.

Figure 3A:
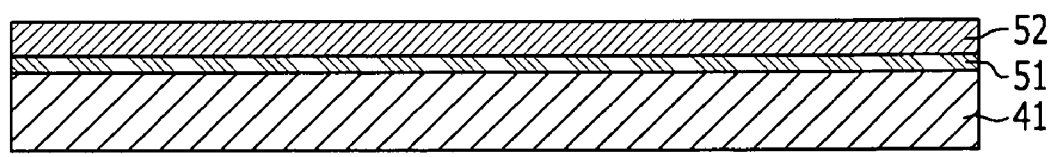
FIG. 3A to FIG. 3G are cross-sectional views of a manufacturing process for the OLED display according to an exemplary embodiment of the present invention.

Referring to FIG. 3A, a buffer layer 51 is formed on the substrate 41. The buffer layer 51 prevents diffusion of moisture or impurities from entering the substrate 41. The buffer layer 51 may be formed of, for example, one of a silicon oxide layer, a silicon nitride layer, or a multilayer including both. In addition, an amorphous silicon layer 52 is formed on the buffer layer 51. The amorphous silicon layer 52 may be formed using, for example, plasma chemical vapor deposition (PCVD) or low pressure chemical vapor deposition (LPCVD).

Figure 3B:
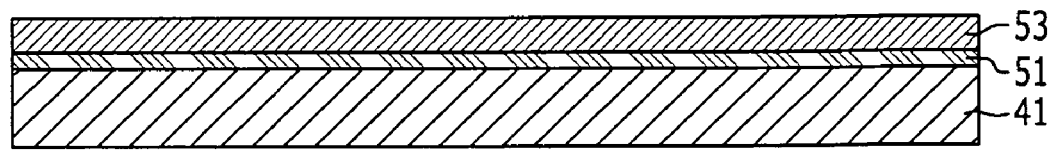

Referring to FIG. 3B, the polycrystalline silicon layer 53 is formed by crystallizing the amorphous silicon layer 52. The polycrystalline silicon layer 53 may be formed using, for example, at least one of solid phase crystallization, sequential lateral solidification crystallization, excimer laser annealing, metal conductive crystallization, and metal conductive lateral crystallization. A natural oxide layer, an organic contaminant, and a metal contaminant exist on the surface of the polycrystalline silicon layer 53 formed through such a thermal treatment.

Figure 3C:
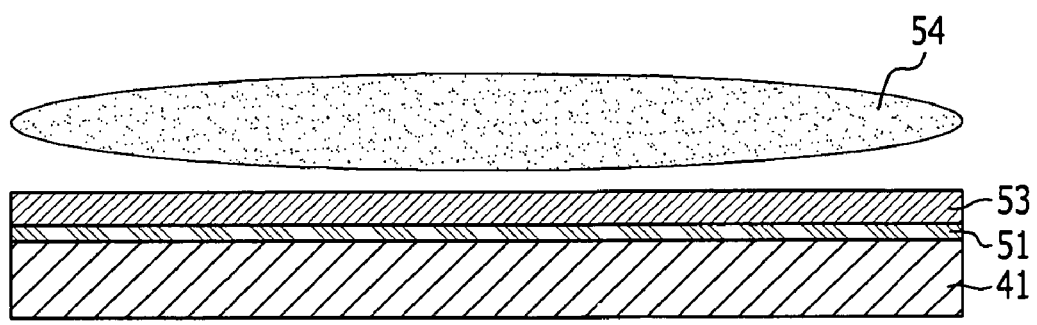
Figure 3D:
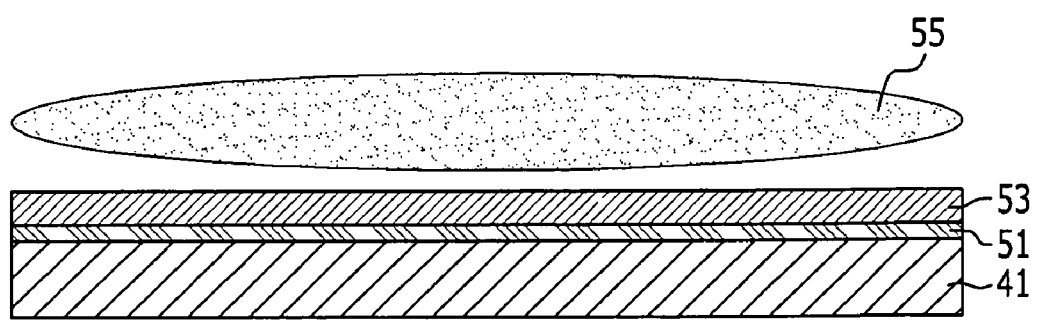
Figure 3E:
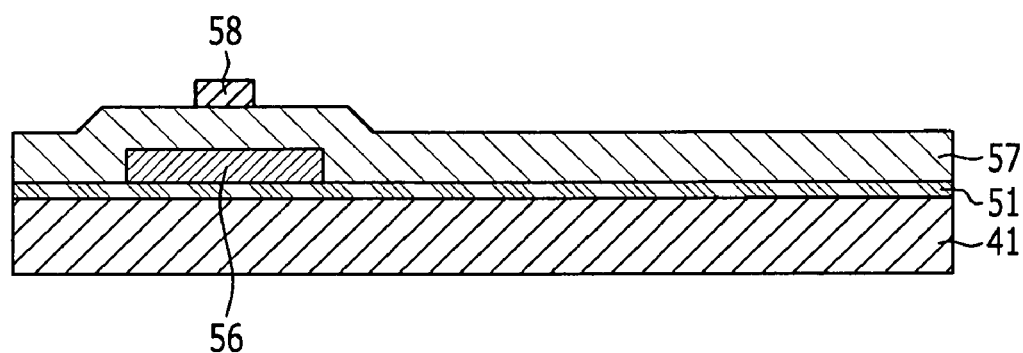

Referring to FIG. 1 and FIG. 3C, the substrate 41 where the polycrystalline silicon layer 53 is formed is transferred between the driving electrode 11 and ground electrode 12 by operating the substrate loading unit 40 of the cleansing device 100. In addition, the first reaction gas is supplied to the electrode cover 13 through the reaction gas supply pipe 21 using the plurality of control valves 23, the plurality of flow controllers 24, and the second control valve 25. The driving electrode 11 is coupled with the power supply 30 and receives a high power voltage for generation of a first atmospheric pressure plasma 54.

The first reaction gas supplied to the electrode cover 13 is ionized while passing through the openings 14 of the driving electrode 11 such that the first atmospheric pressure plasma 54 is generated at a lower portion of the driving electrode 11. The first reaction gas includes a sulfur hexafluoride ($SF_6$) gas, an oxygen ($O_2$) gas, and a nitrogen ($N_2$) gas. When the polycrystalline silicon layer 53 is exposed to the first atmospheric pressure plasma 54, fluorine particles provide an etching effect, similar to that of a hydrofluoric acid solution (HF), to reduce or eliminate a native oxide on the surface of the polycrystalline silicon layer 53. Through such a process, a primary cleansing process is performed.

In the primary cleansing process, a flow amount (e.g., a flow rate) of the $SF_6$ gas may be 1 sccm (standard cubic centimeters per minute, or cm$^3$/min) to 20 sccm, a flow amount of the $O_2$ gas may be 1 sccm to 5 sccm, and the $N_2$ gas may be 800 lpm (liters per minute, or l/min) to 1,000 lpm. In addition, an output of the power supply 30 may be 10 kW to 20 kW. When the flow amount and the output of each gas exceed the above-stated range, arcing and/or an over-etching defect may occur.

Compared to existing methods of wet cleansing using a HF solution, the primary cleansing using the first atmospheric pressure plasma is advantageous in that a fewer amount of particles is generated and the surface uniformity of the polycrystalline silicon layer 53 is excellent.

When performing wet cleansing using a HF solution, the HF solution may not uniformly etch the surface of the polycrystalline silicon layer 53, and accordingly, the surface uniformity of the polycrystalline silicon layer 53 is low, and particles may be generated on the polycrystalline silicon layer 53 after the cleansing. Thus, when thin film transistors including the polycrystalline silicon layer 53 are manufactured, and a display device (e.g., organic light emitting diode display or liquid crystal display) is manufactured using thin film transistors, a stain failure may occur (e.g., may be detected) in the image quality test.

However, in the present exemplary embodiment, the first atmospheric pressure plasma 54 having uniform density can be generated over a large area between the driving electrode 11 and the ground electrode 12 so that the native oxide can be uniformly etched by uniformly inducing a chemical reaction in the surface of the polycrystalline silicon layer 53. In addition, no particle is generated at the surface of the polycrystalline silicon layer 53 after the cleansing with the first atmospheric pressure plasma 54. Accordingly, after the display device is manufactured, the stain failure can be prevented in the image quality test.

The native oxide elimination effect can be determined by measuring a surface contact angle of a droplet. That is, a droplet is dropped on the polycrystalline silicon layer 53, and a surface contact angle of the droplet is measured, and it can be determined that the native oxide is eliminated (or substantially eliminated) when the surface contact angle is greater than 50°.

Figure 4:
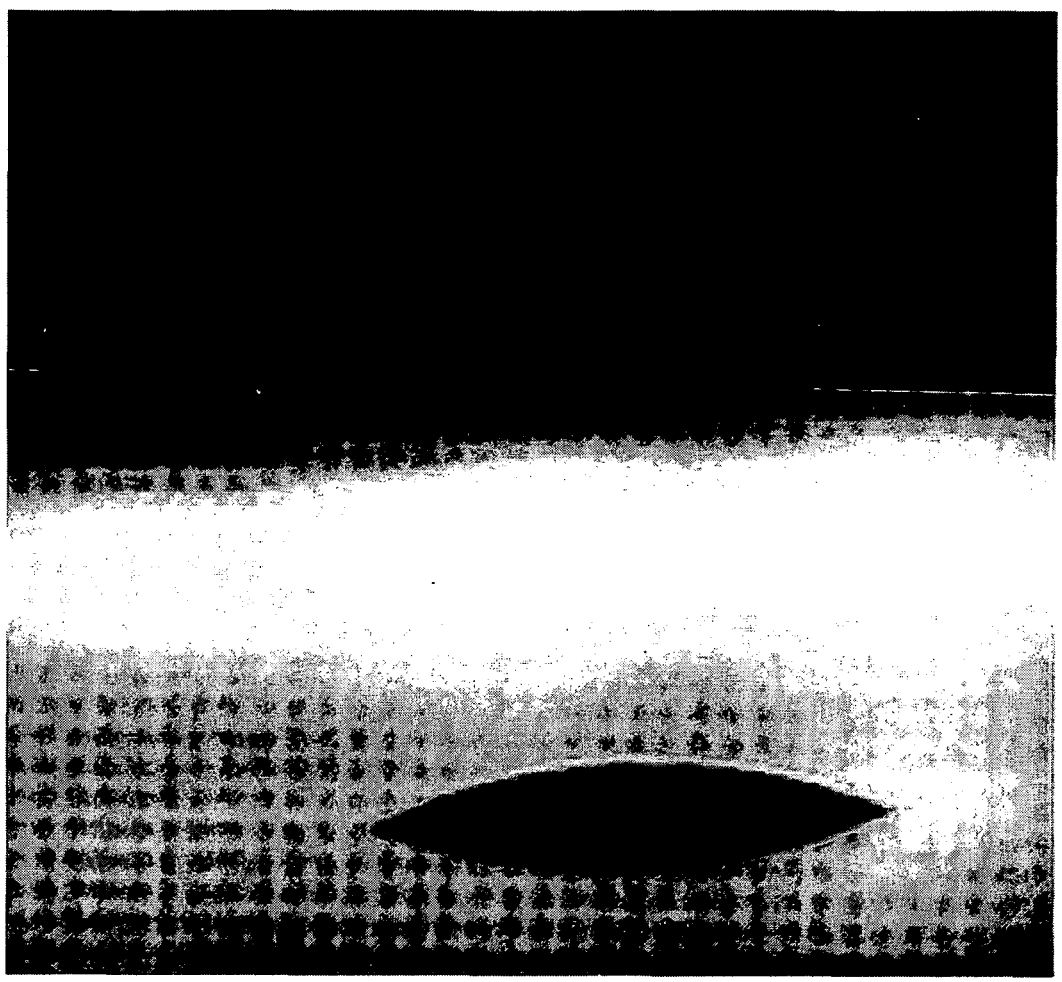
FIG. 4 is a photograph of a surface contact angle of a droplet measured by dropping the droplet on a surface of a polycrystalline silicon layer before primary cleansing.
Figure 5:
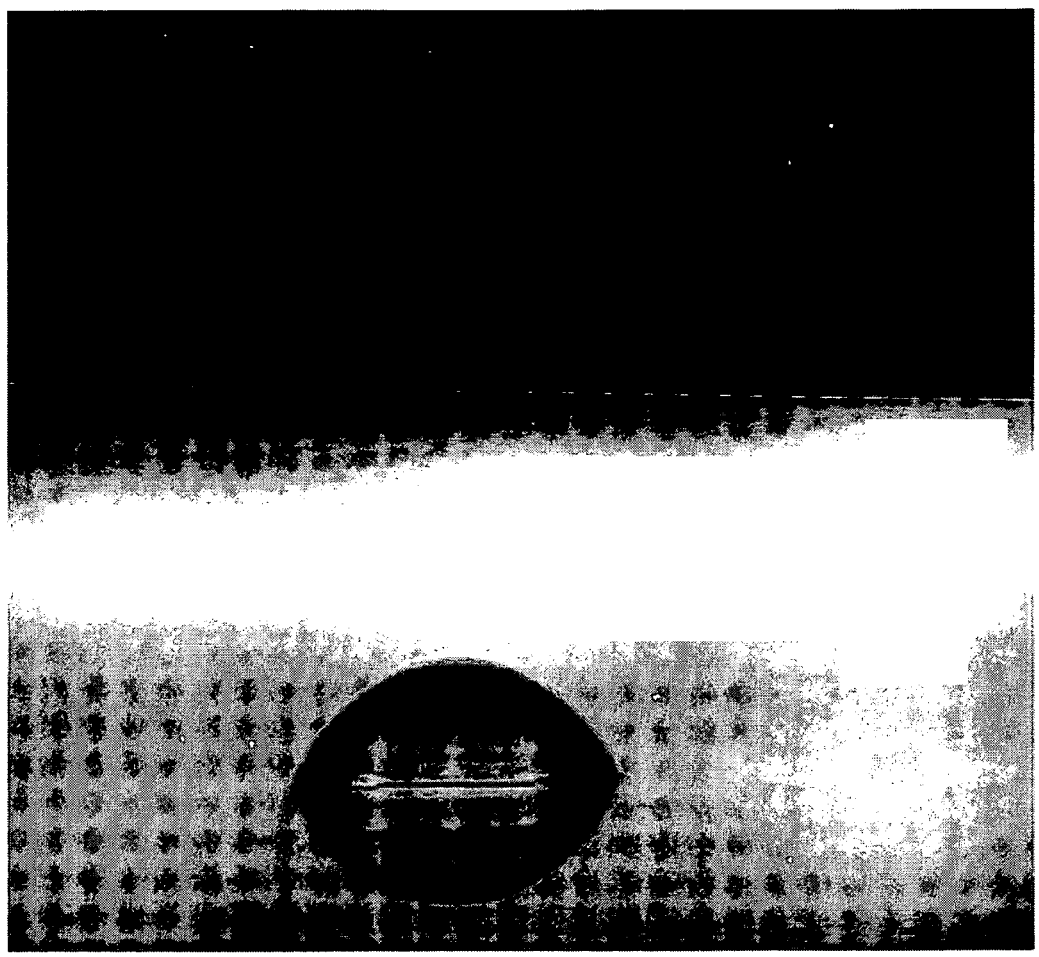
FIG. 5 is a photograph of a surface contact angle of a droplet measured by dropping the droplet on the surface of the crystalline silicon layer after the primary cleansing according to an exemplary embodiment of the present invention.

FIG. 4 is a photograph of a surface contact angle of a droplet measured by dropping the droplet on a surface of a polycrystalline silicon layer before primary cleansing, and FIG. 5 is a photograph of a surface contact angle of a droplet measured by dropping the droplet on the surface of the crystalline silicon layer after the primary cleansing according to an embodiment of the present invention. The type and the flow amount of the first reaction gas and an output of the power supply used in the test are the same as those in the above-stated range.

Referring to FIG. 4 and FIG. 5, a surface contact angle of the droplet before the first portion of the atmospheric pressure plasma treatment using the first reaction gas may be smaller than 30°, but the surface contact angle of the droplet after the primary cleansing is greater than 50°. This shows that the native oxide is eliminated (or substantially eliminated).

Referring back to FIG. 1 and FIG. 3D, the supply of the first reaction gas is blocked, and the second reaction gas is supplied to the electrode cover 13 through the reaction gas supply pipe 21 using the plurality of first control valves 23, the plurality of flow amount controllers 24, and the second control valve 25. The second reaction gas is ionized while passing through the openings 14 of the driving electrode 11 such that a second atmospheric pressure plasma 55 is generated at a lower portion of the driving electrode 11.

The second reaction gas includes an argon (Ar) gas, an oxygen ($O_2$) gas, and a nitrogen ($N_2$) gas. When the polycrystalline silicon layer 53 is exposed to the second atmospheric pressure plasma 55, oxygen particles of the second atmospheric pressure plasma 55 generate ozone ($O_3$), and the ozone provides a cleansing effect, similar to that of a conventional ozone water cleansing, so that organic and metal contaminants are reduced or eliminated. Through such a process, a secondary cleansing process is performed. After the secondary cleansing, the surface tension of the polycrystalline silicon layer 53 is weakened so that the polycrystalline silicon layer 53 becomes hydrophilic.

In the secondary cleansing process, the flow amount of Ar gas may be 1 sccm to 5 sccm, the flow amount of $O_2$ gas may be 1 sccm to 10 sccm, and the flow amount of $N_2$ gas may be 800 lpm to 1,000 lpm. In addition, an output of the power supply 30 may be 10 kW to 20 kW. When the flow amount of each gas and the output exceed the above-stated ranges, arcing or an over-cleansing defect may occur.

The secondary cleansing effect by ozone can be determined by measuring the surface contact angle of the droplet. That is, the surface contact angle of the droplet at the surface of the polycrystalline silicon layer 53 is measured, and it can be determined that organic and metal contaminants are reduced or eliminated and the surface of the polycrystalline silicon layer 53 becomes hydrophilic when the surface contact angle is smaller than 10°.

Figure 6:
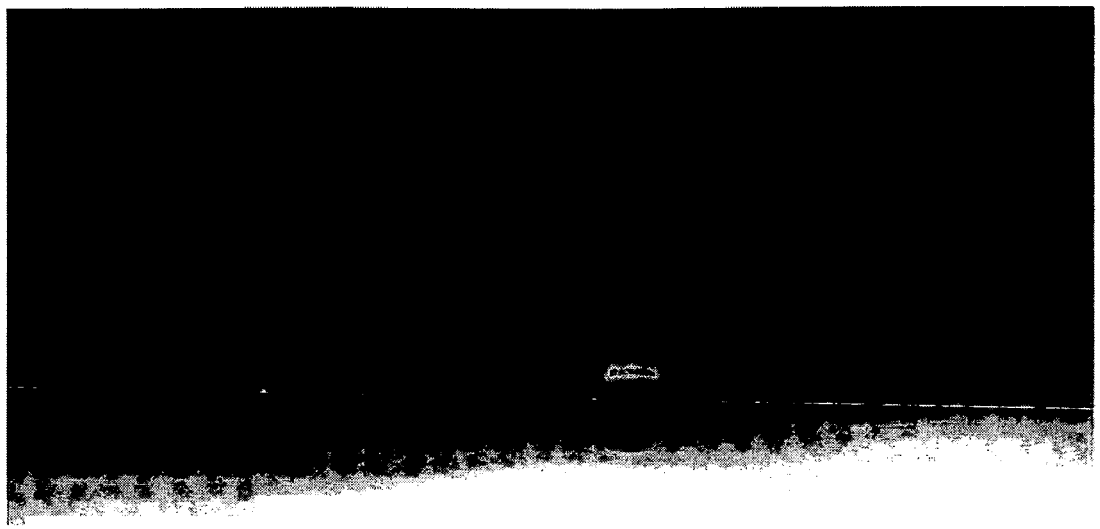
FIG. 6 is a photograph of a surface contact angle of a droplet measured by dropping the droplet on the surface of the crystalline silicon layer before secondary cleansing.
Figure 6:
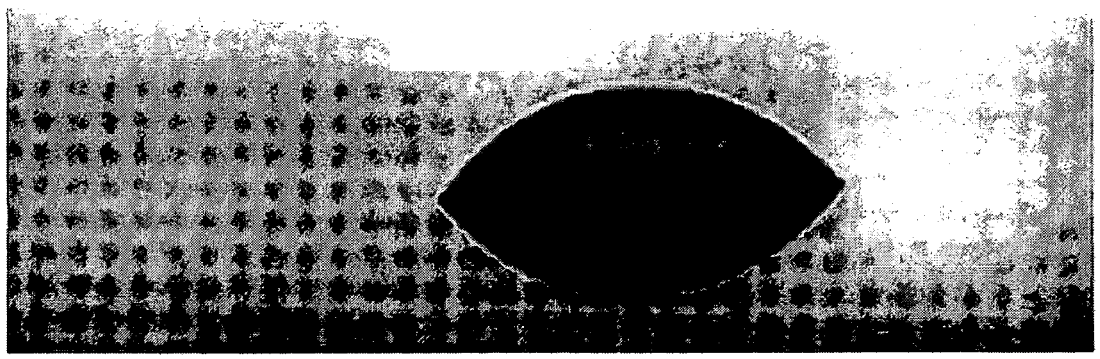
Figure 7:
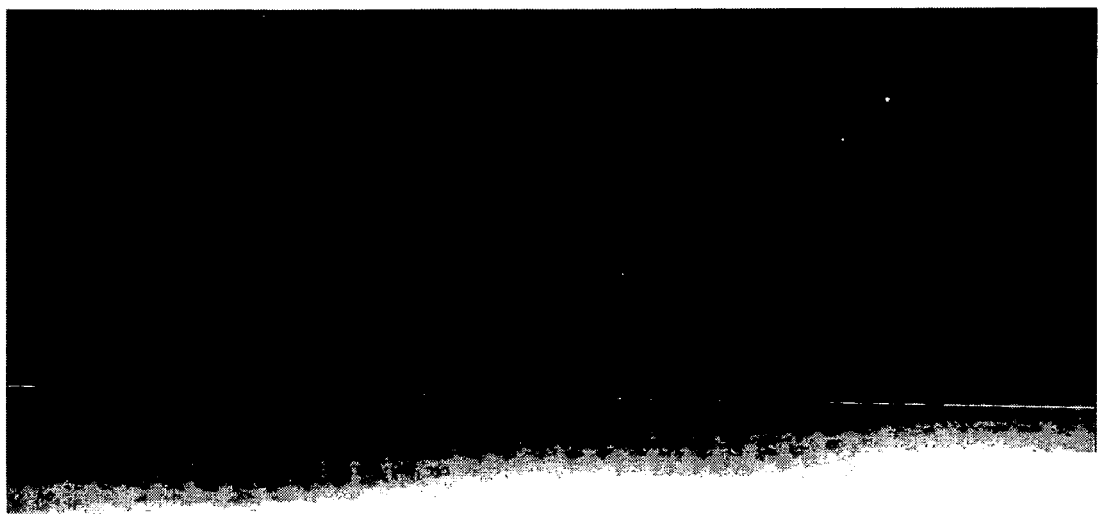
FIG. 7 is a photograph of a surface contact angle of a droplet measured by dropping the droplet on the surface of the crystalline silicon layer after the secondary cleansing according to an exemplary embodiment of the present invention.
Figure 7:
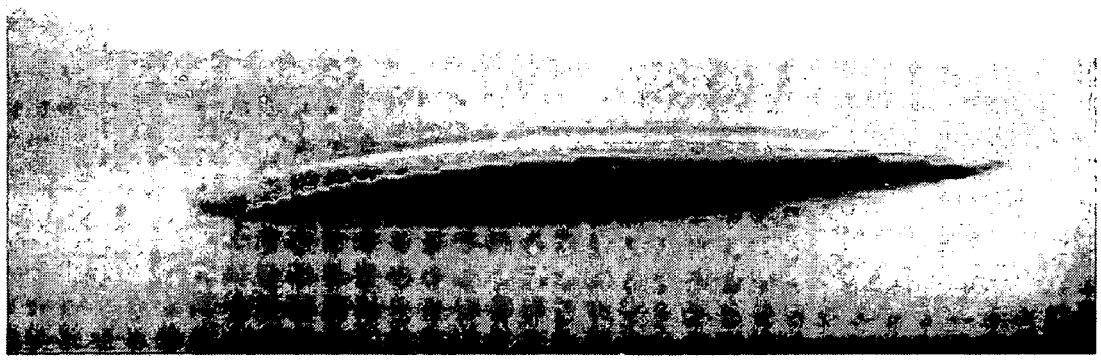

FIG. 6 is a photograph of a surface contact angle of a droplet measured by dropping the droplet on the surface of the crystalline silicon layer before secondary cleansing, and FIG. 7 is a photograph of a surface contact angle of the droplet measured by dropping the droplet on the surface of the crystalline silicon layer after the secondary cleansing according to an embodiment of the present invention. The type and flow amount of second reaction gas and an output of the power supply used in the experiment are the same as those of the above-stated ranges.

Referring to FIG. 6 and FIG. 7, a surface contact angle of a droplet before a second portion of the atmospheric pressure plasma treatment using the second reaction gas is about 40°, but the surface contact angle of the droplet becomes smaller than 10° after the secondary cleansing, so that it can be determined that organic and metal contaminants are reduced or eliminated and the surface of the polycrystalline silicon layer becomes hydrophilic.

The secondary cleansing using the second atmospheric pressure plasma 55 is performed at the same location and with the same device as the primary cleansing. That is, when compared to the primary cleansing, only the reaction gas was changed in the secondary cleansing. Thus, the substrate 41 completed with the primary cleansing does not need to be transferred to another device or another stage, and the entire cleansing process and the cleansing device can be simplified, thereby reducing process expense required for cleansing the polycrystalline silicon layer 53. According to the present exemplary embodiment, the primary and secondary cleansing can be completed in about 20 seconds for each substrate.

Referring back to FIG. 3E, the polycrystalline silicon layer 53 completed (e.g., cleansed) with the primary and secondary cleansing is patterned to form a semiconductor layer 56. A gate insulating layer 57 is formed on a front side of the substrate 41. The gate insulating layer 57 may be formed with a silicon nitride.

A gate metal layer is formed on the gate insulating layer 57, and a gate electrode 58 is formed by patterning the gate metal layer. The gate electrode 58 may be formed of, for example, a single layer of aluminum, an aluminum alloy, or a multiple-layer formed by stacking an aluminum alloy on chromium or a molybdenum alloy.

Figure 3F:
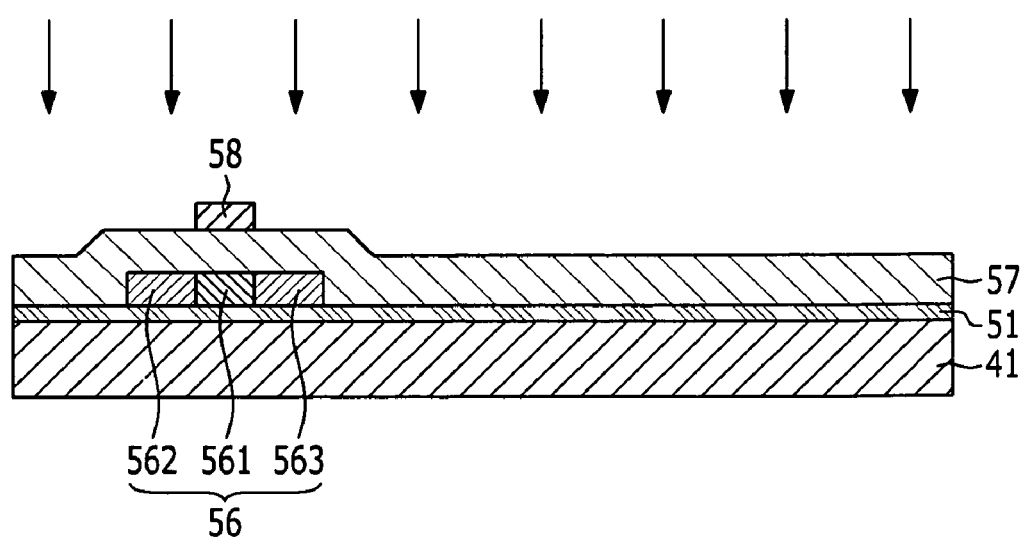

Referring to FIG. 3F, conductive impurity ions are partially injected into the semiconductor layer 56 using the gate electrode 58 as a mask. Thus, the semiconductor layer 56 is divided into a channel area 561 where the impurity ions are not injected, and source and drain areas 562 and 563 where the impurity ions are injected. The channel area 561 is located between the source area 562 and the drain area 563, and the impurity ion may be a p-type impurity or an n-type impurity.

Figure 3G:
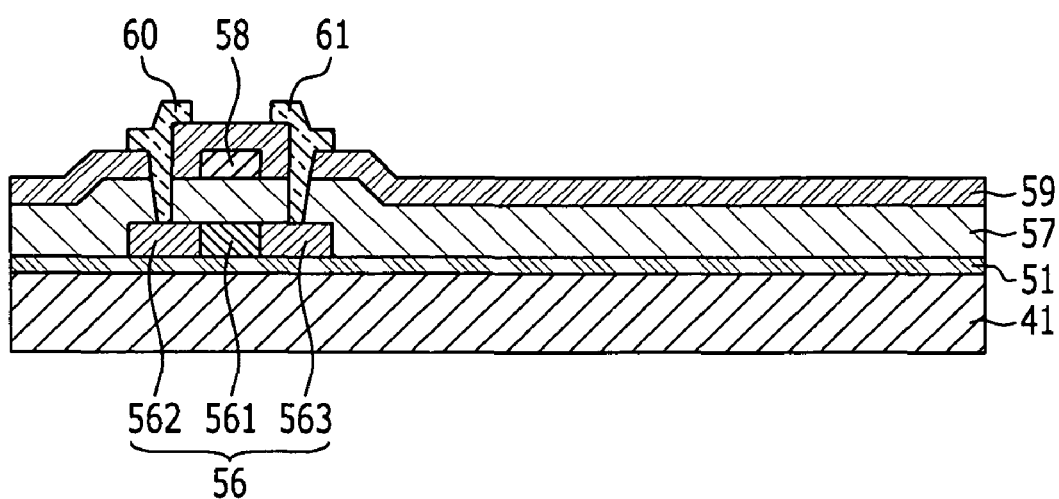

Referring to FIG. 3G, an interlayer insulating layer 59 is formed on the front side of the gate insulating layer 57 where the gate electrode 58 is formed, and contact holes that expose the source area 562 and the drain area 563 are formed by patterning the interlayer insulating layer 59 and the gate insulating layer 57. In addition, a source electrode 60 and a drain electrode 61 are formed on the interlayer insulating layer 59. The source electrode 60 and the drain electrode 61 are respectively coupled with the source area 562 and the drain area 563.

Through the above-stated process, the thin film transistor is completed. An OLED display according to an exemplary embodiment of the present invention uses the thin film transistor as a driving element. An OLED display including the thin film transistor will be described with reference to FIG. 8 and FIG. 9.

Figure 8:
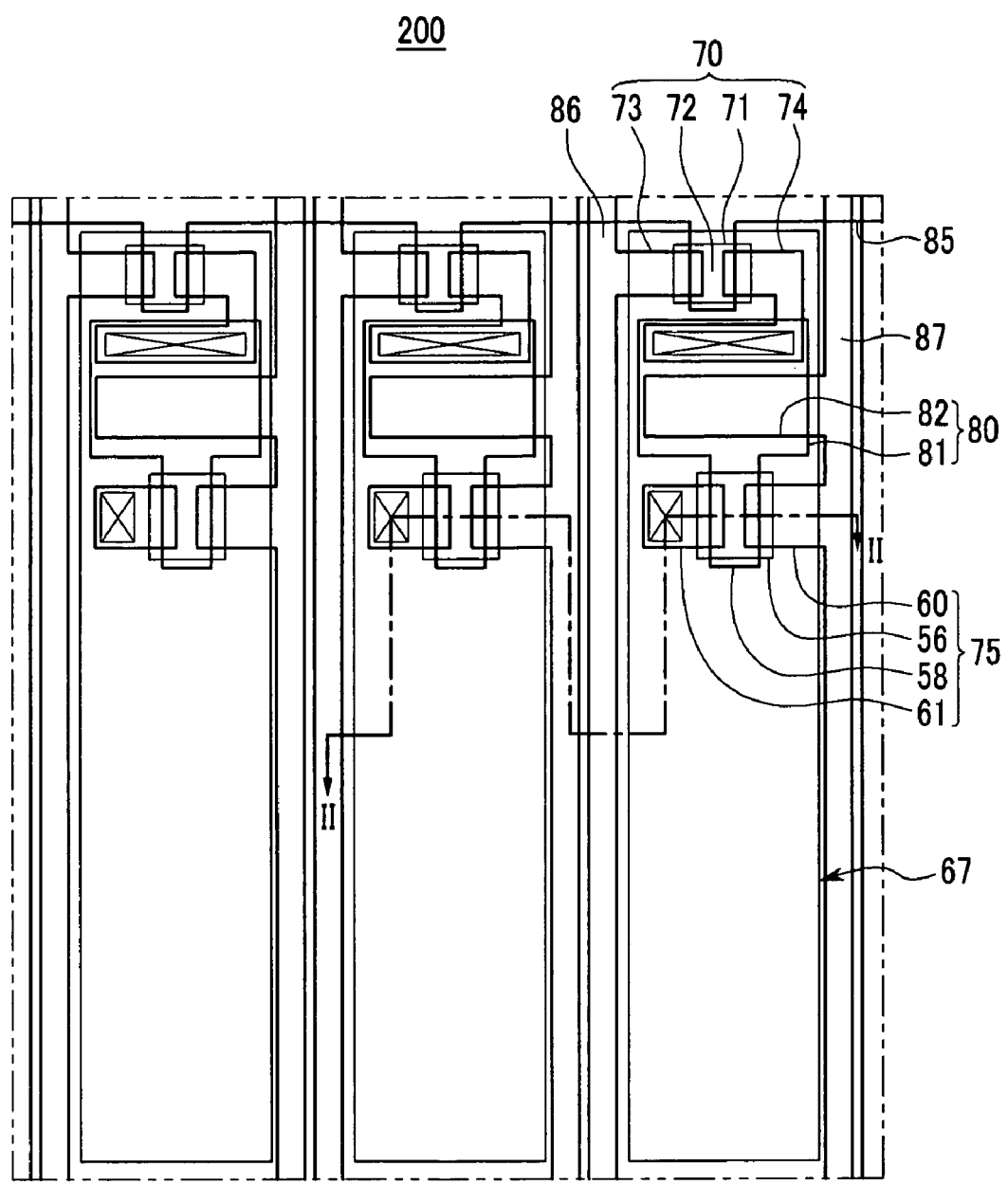
FIG. 8 is a layout view of an OLED display according to an exemplary embodiment of the present invention.
Figure 9:
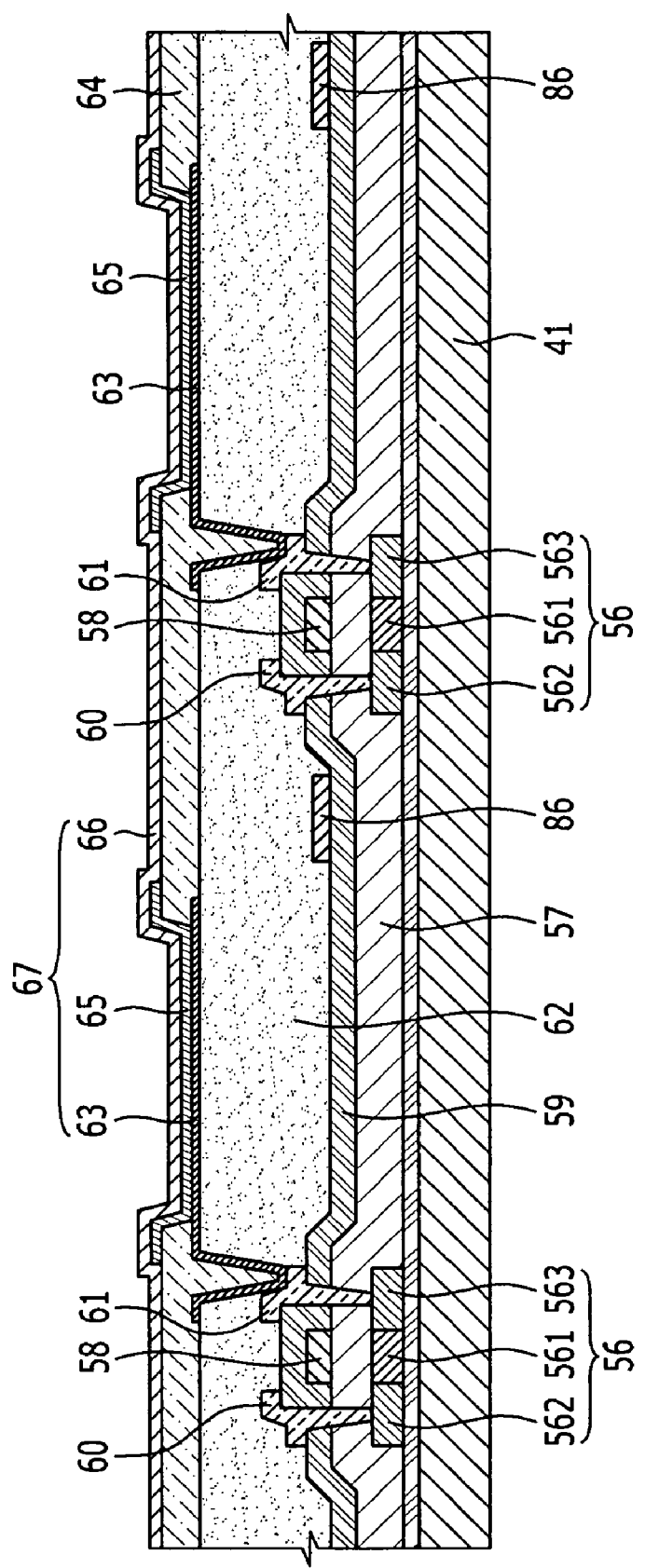
FIG. 9 is a cross-sectional view of the OLED display of the embodiment shown in FIG. 8, taken along the line II-II.

FIG. 8 is a layout view of an OLED display according to an exemplary embodiment of the present invention, and FIG. 9 is a cross-sectional view of the OLED display of the embodiment shown in FIG. 8, taken along the line II-II.

Referring to FIG. 8 and FIG. 9, a planarization layer 62 is formed on the source electrode 60, the drain electrode 61, and the interlayer insulating layer 59. The planarization layer 62 forms a via hole that exposes the drain electrode 61. A pixel electrode 63 is formed on the planarization layer 62, and the pixel electrode 63 is coupled with the drain electrode 61 through the via hole of the planarization layer 62.

A pixel defining layer 64 is formed on the pixel electrode 63 and the planarization layer 62. The pixel defining layer 64 forms an opening to partially expose the pixel electrode 63. In addition, an organic emission layer 65 is formed on the exposed pixel electrode 63, and a common electrode 66 is formed on the front sides of the organic emission layer 65 and the pixel defining layer 64. The pixel electrode 63, the organic emission layer 65, and the common electrode 66 form an organic light emitting element 67.

The pixel electrode 63 may be a hole injection electrode (anode), and the common electrode 66 may be an electron injection electrode (cathode). Alternatively, the pixel electrode 63 may be the electron injection electrode, and the common electrode 66 may be the hole injection electrode. When the pixel electrode 63 is a hole injection electrode, and the common electrode 66 is an electron injection electrode, the organic emission layer 65 is formed of a hole injection layer (HIL), a hole transport layer (HTL), an emission layer, an electron transport layer (ETL), and an electron injection layer (EIL) that are sequentially stacked from the pixel electrode 63. Holes and electrons are injected to the organic emission layer 65 from the pixel electrode 63 and the common electrode 66, and emission of light from the organic emission layer 65 occurs when the excitons of the combinations of the injected holes and electrons drop from an excited state to a ground state.

In case of a top emission type OLED display, the pixel electrode 63 is formed as a reflective conducting layer, and the common electrode 66 is formed as a transflective conducting layer. In case of a bottom emission type OLED display, the pixel electrode 63 is formed as a transflective conducting layer, and the common electrode 66 is formed as a reflective conducting layer. In the bottom emission type OLED display, the pixel electrode 63 may be formed of a triple layer of indium tin oxide (ITO)/silver(Ag)/ITO (e.g., a layer of Ag between two layers of ITO), and the common electrode 66 may be formed of a silver (Ag) or aluminum (Al) thin film.

An OLED display 200 includes a switching thin film transistor 70, a driving thin film transistor 75, a capacitor 80, and an organic light emitting element 67 that are formed in each pixel. The OLED display 200 further includes gate lines 85 arranged in one direction, and data lines 86 and common voltage lines 87 crossing the gate lines 85 in an insulated manner.

One pixel may be defined by a gate line 85, a data line 86, and a common voltage line 87 as the boundary, but the present invention is not restricted to such. The pixel is formed of one sub-pixel or a plurality of sub-pixels, and a minimum unit displaying an image.

The capacitor 80 includes a first capacitor plate 81 and a second capacitor plate 82 having an interlayer insulating layer 59 therebetween. The interlayer insulating layer 59 is formed with a dielectric material. Charges in the capacitor 80 and a voltage between the first and second capacitor plates 81 and 82 correspond to capacitance.

The switching thin film transistor 70 includes a switching semiconductor layer 71, a switching gate electrode 72, a switching source electrode 73, and a switching drain electrode 74. The driving thin film transistor 75 includes a driving semiconductor layer 56, a driving gate electrode 58, a driving source electrode 60, and a driving drain electrode 61. The switching semiconductor layer 71 and the driving semiconductor layer 56 are manufactured through the primary cleansing process using the first atmospheric pressure plasma and the secondary cleansing process using the second atmospheric pressure plasma.

The switching thin film transistor 70 is used as a switch that selects a pixel for light emission. The switching gate electrode 72 is coupled to the gate line 85. The switching source electrode 73 is coupled to the data line 86. The switching drain electrode 74 is separated from the switching source electrode 73, and is coupled to the first capacitor plate 81.

The driving thin film transistor 75 applies a driving voltage for light emission of an organic emission layer 65 of a selected pixel to the pixel electrode 63. The driving gate electrode 58 is coupled to the first capacitor plate 81, and the driving source electrode 60 and the second capacitor plate 82 are coupled to the common voltage line 87. The driving drain electrode 61 is coupled with the pixel electrode 63 of the organic light emitting element 67 through a via hole.

In the above-stated structure, the switching thin film transistor 70 is driven by a scan voltage applied to the gate line 85, and transmits a data voltage applied to the data line 86 to the driving thin film transistor 75. A voltage, which corresponds to a difference between a common voltage applied to the driving thin film transistor 75 from the common voltage line 87 and the data voltage transmitted from the switching thin film transistor 70, is stored in the capacitor 80, and a current corresponding to the voltage stored in the capacitor 80 flows to the organic light emitting element 67 through the driving thin film transistor 75 such that the organic emission layer 65 emits light.

The organic light emitting element 67 is formed on the planarization layer 62, but the location of the organic light emitting element 67 is not limited thereto. That is, the organic light emitting element 67 may be located on the gate insulating layer 57, in which case the OLED display can be manufactured through a process using five pattern masks.

While this disclosure has been described in connection with what is presently considered to be practical exemplary embodiments, it is to be understood that the invention is not limited to the disclosed embodiments, but, on the contrary, is intended to cover various modifications and equivalent arrangements of the aforementioned embodiments included within the spirit and scope of the appended claims, as well as their equivalents.

| Description of Some of the Reference Characters | |
|---|---|
| 100: cleansing device | 10: plasma generator |
| 11: driving electrode | 12: ground electrode |
| 13: electrode cover | 151: first cover |
| 152: second cover | 20: reaction gas supply |
| 21: reaction gas supply pipe | 30: power supply |
| 40: substrate loading unit | 41: substrate |
| 67: organic light emitting element | 70: switching thin film transistor |
| 75: driving thin film transistor | 80: capacitor |
| 85: gate line | 86: data line |
| 87: common voltage line | 200: OLED display |

What is claimed is:

1. A method for manufacturing an organic light emitting diode (OLED) display, comprising:

forming a polycrystalline silicon layer on a substrate;

reducing or eliminating a native oxide at a surface of the polycrystalline silicon layer by etching using a first atmospheric pressure plasma generated by plasmatizing fluorine-containing gas;

reducing or eliminating organic and metal contaminants at the surface of the polycrystalline silicon layer using a second atmospheric pressure plasma generated by plasmatizing oxygen-containing gas;

forming a semiconductor layer by patterning the polycrystalline silicon layer;

forming a gate insulating layer and a gate electrode on the semiconductor layer;

forming a channel area, a source area, and a drain area in the semiconductor layer by impurity doping;

forming an interlayer insulating layer on the gate electrode;

forming a source electrode coupled with the source area on the interlayer insulating layer;

forming a drain electrode coupled with the drain area on the interlayer insulating layer;

forming a pixel electrode coupled with the drain electrode; and forming an organic emission layer and a common electrode on the pixel electrode.

2. The method of claim 1, wherein reducing or eliminating the native oxide and reducing or eliminating the organic and metal contaminants follow forming the polycrystalline silicon layer and comprise:

placing the substrate between a driving electrode and a ground electrode of a cleansing device after forming the polycrystalline silicon layer; and applying 10 kW to 20 kW to the driving electrode.

3. The method of claim 1, wherein reducing or eliminating the native oxide and reducing or eliminating the organic and metal contaminants comprise using a single cleansing device at a single location.

4. The method of claim 1, wherein the plasmatized oxygen-containing gas comprises argon (Ar) gas, oxygen ($O_2$) gas, and nitrogen ($N_2$) gas.

5. The method of claim 4, wherein reducing or eliminating the native oxide and reducing or eliminating the organic and metal contaminants follow forming the polycrystalline silicon layer and comprise:

placing the substrate between a driving electrode and a ground electrode of a cleansing device after forming the polycrystalline silicon layer; and applying 10 kW to 20 kW to the driving electrode.

6. The method of claim 4, wherein, when reducing or eliminating organic and metal contaminants of the polycrystalline silicon layer, a flow rate of Ar gas is 1 sccm to 5 sccm, a flow rate of $O_2$ gas is 1 sccm to 10 sccm, and a flow rate of $N_2$ gas is 800 lpm to 1,000 lpm.

7. The method of claim 6, wherein reducing or eliminating the native oxide and reducing or eliminating the organic and metal contaminants follow forming the polycrystalline silicon layer and comprise:

placing the substrate between a driving electrode and a ground electrode of a cleansing device after forming the polycrystalline silicon layer; and applying 10 kW to 20 kW to the driving electrode.

8. The method of claim 1, wherein the plasmatized fluorine-containing gas comprises sulfur hexafluoride ($SF_6$) gas, oxygen ($O_2$) gas, and nitrogen ($N_2$) gas.

9. The method of claim 8, wherein reducing or eliminating the native oxide and reducing or eliminating the organic and metal contaminants follow forming the polycrystalline silicon layer and comprise:

placing the substrate between a driving electrode and a ground electrode of a cleansing device after forming the polycrystalline silicon layer; and applying 10 kW to 20 kW to the driving electrode.

10. The method of claim 8, wherein, when reducing or eliminating the native oxide of the polycrystalline silicon layer, a flow rate of $SF_6$ gas is 1 sccm to 5 sccm, a flow rate of $O_2$ gas is 1 sccm to 5 sccm, and a flow rate of $N_2$ gas is 800 lpm to 1,000 lpm.

11. The method of claim 10, wherein reducing or eliminating the native oxide and reducing or eliminating the organic and metal contaminants follow forming the polycrystalline silicon layer and comprise:

placing the substrate between a driving electrode and a ground electrode of a cleansing device after forming the polycrystalline silicon layer; and applying 10 kW to 20 kW to the driving electrode.

* * * * *